United States Patent [19]
Robinson

[11] 4,157,207

[45] Jun. 5, 1979

[54] SOCKET FOR ELECTRICAL CIRCUIT BOARD

[75] Inventor: Samuel C. Robinson, New Albany, Ind.

[73] Assignee: Robinson Nugent Inc., New Albany, Ind.

[21] Appl. No.: 908,984

[22] Filed: May 24, 1978

Related U.S. Application Data

[63] Continuation-in-part of Ser. No. 803,631, Jun. 6, 1977, abandoned.

[51] Int. Cl.$^2$ ............ H05K 1/12

[52] U.S. Cl. ............ 339/17 C; 339/221 M; 339/258 P; 339/276 A

[58] Field of Search ............ 339/17 R, 17 C, 19, 339/221, 193, 256, 258, 275 B, 276 A, 17 CF, 220

[56] References Cited

U.S. PATENT DOCUMENTS

| | | | |
|---|---|---|---|
| 1,939,130 | 12/1933 | Mills | 339/258 P |
| 2,290,172 | 7/1942 | Eby | 339/258 P |
| 2,514,562 | 7/1950 | Stickney | 339/193 R |
| 2,563,775 | 8/1951 | Del Camp | 339/221 M |
| 2,959,762 | 11/1960 | Schlee | 339/276 A |
| 3,031,635 | 4/1962 | Gluck | 339/193 P |
| 3,087,136 | 4/1963 | Peterson et al. | 339/276 A |
| 3,562,591 | 2/1971 | Schmidt | 339/17 CF |

FOREIGN PATENT DOCUMENTS

| | | | |
|---|---|---|---|
| A74870 | 1/1961 | France | 339/258 R |

*Primary Examiner*—Neil Abrams
*Attorney, Agent, or Firm*—Woodard, Weikart, Emhardt & Naughton

[57] ABSTRACT

A U-shaped base member of resilient, electrically-conductive material has upwardly-projecting arms thereof received in apertures in a circuit board. An adaptor member, having a U-shaped portion has one arm thereof cooperating with one arm of the base member to establish an anchor in one aperture of the board, and the other arm cooperates with a socket-forming channel in the other arm of the base member in the adjacent aperture of the board, to provide a socket for reception of a lead of a microelectronic circuit device such as an integrated circuit (IC) pack and also serve as a second anchor in the second aperture. The adaptor member also includes means appropriate for connection to electrical circuitry associated with the circuit board and/or electrical connection to other adaptor members or to other circuit components in a system. Examples of such connection means may include "Wire-Wrap" pins, wire-piercing jaws or "Stitch Weld" or "Solder Wrap" pads.

39 Claims, 39 Drawing Figures

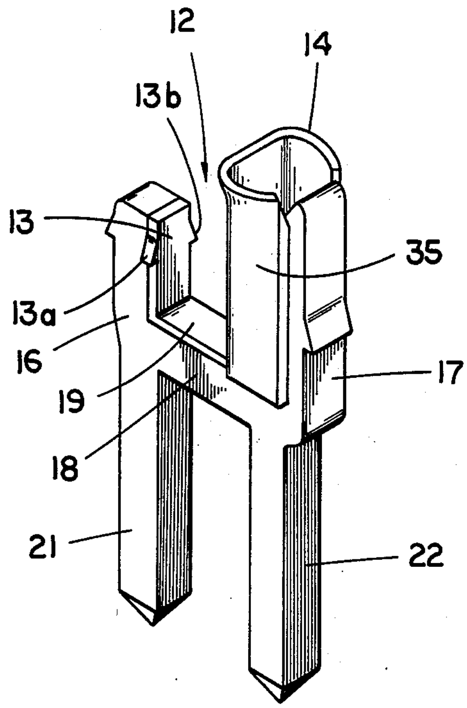
Fig. 1
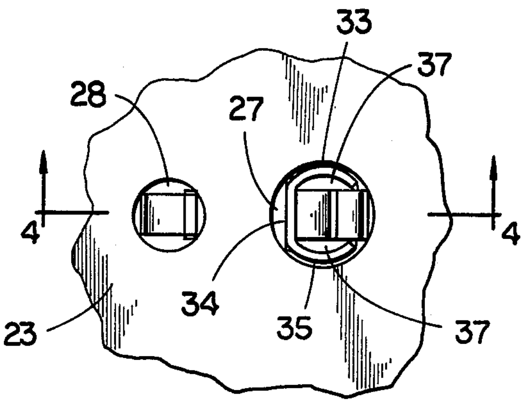
Fig. 3
Fig. 2
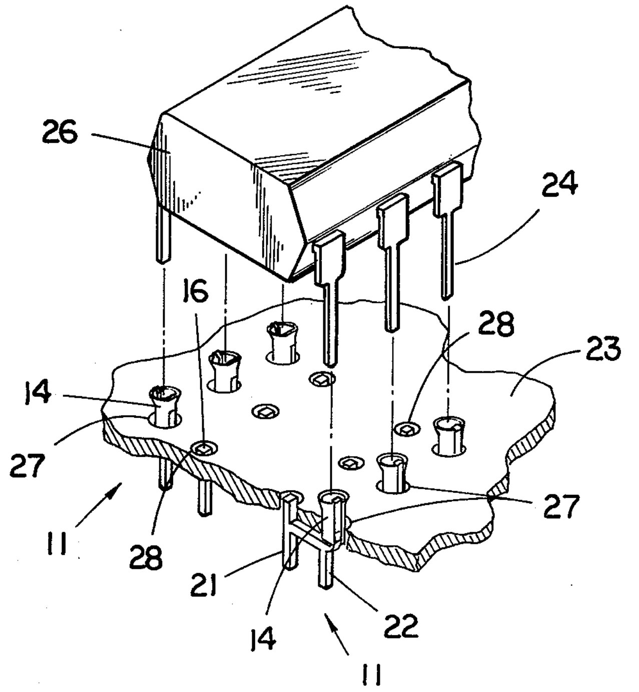

SOCKET FOR ELECTRICAL CIRCUIT BOARD

CROSS REFERENCE TO RELATED APPLICATIONS

This application is a continuation-in-part of my application Ser. No. 803,631 filed June 6, 1977, now abandoned.

BACKGROUND OF THE INVENTION

1. Field of the Invention:

This invention relates generally to electrical circuit boards, and more particularly to contacts facilitating the mounting of electrical components to a support, and electrical connection of such components to circuitry and/or each other.

2. Description of the Prior Art:

There is a great variety of devices for connecting electrical components to support devices and to electrical circuitry. In recent years, much emphasis has been placed on devices particularly adapted to convenient mounting of microelectronic circuit devices, typically integrated circuit chips, to circuit boards of the printed or wired type. In addition to making such devices useful with the printed circuitry in boards themselves, it has been desirable to provide pins thereon for wrapping wire around them, or pads for welding or soldering wire to them. It is desirable that such devices be removable from a board and replaceable individually, if necessary.

Examples of several of the many United States patents dealing with electrical contact members which might be useful for mounting a component to a board or socket member, and connection to electrical circuitry are as follows:

| | | |
|---|---|---|
| 3,555,497 | Watanabe | 1/12/71 |
| 3,659,243 | Gluntz | 4/25/72 |
| 3,718,895 | Reynolds et al | 2/27/73 |

Other U.S. Patents dealing with electrical contact members useful for mounting components to socket members and connection to electrical circuitry have been cited in my aforementioned Patent application Ser. No. 803,631.

One problem encountered with the conventional wire-wrap contacts is the susceptibility to turning of the contact in the hole as wire is wrapped on the pin. Another is alignment of the pin in order to avoid interference with the wire-wrapping machine. Another is the compounded torque problem created in the event it is necessary to wrap a pin two or three times. Still another is the overall height required for two wraps on a given pin. Space is at a premium in many applications.

It is an object of my invention to provide a socket for mounting components and making a variety of possible types of electrical connections to it, while minimizing the aforementioned problems.

BRIEF SUMMARY OF THE INVENTION

In accordance with the present invention, an electrical connector comprises a first member having a generally U-shaped portion with a horizontal bight and vertical left and right arms at opposite ends of said bight, said right arm including a channel having a vertically extending opening at one side of the arm and said right arm including a spring projecting into said channel from a wall of said channel; a second member having a generally U-shaped portion with a horizontal bight and vertical left and right arms at opposite ends of said bight, said left arm of said second member being adjacent said left arm of said first member; and said right arm of said second member being in the channel and adjacent said spring. The two members can be assembled in a wiring board, with the left arms of the members received in one aperture in the board, and the right arms received in another aperture in the board, with the right arms cooperating to provide a socket for receipt of a conductive lead of an electrical circuit component. A plurality of such assemblies can be made in a plurality of apertures in the board so that a multiplicity of leads of a circuit component, or of various components, can be mounted to the board for inclusion in a wired circuit, printed circuit or other type of circuit.

BRIEF DESCRIPTION OF THE DRAWINGS

FIG. 1 is a perspective view of a socket assembly according to one embodiment of the present invention, but the now preferred embodiment is shown in FIG. 10 and following.

FIG. 2 is a perspective view of a circuit board incorporating a plurality of such sockets arranged for reception of leads of an integrated circuit (IC) package.

FIG. 3 is a fragmentary top plan view of a portion of the circuit board showing the socket mounted therein.

DESCRIPTION OF THE ILLUSTRATED EMBODIMENTS

Figure 4:
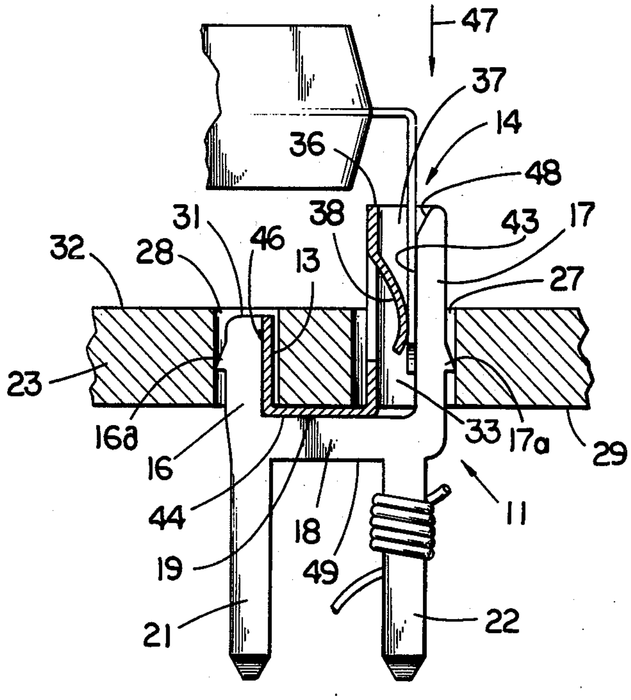
FIG. 4 is a section taken at line 4—4 in FIG. 3 and viewed in the direction of the arrows.

Referring now to the drawings in detail, the socket assembly of FIG. 1, which is intended for use with wire-wrap circuitry, includes a generally U-shaped base member 12 having a left-hand arm 13 and right-hand arm 14. The adaptor member combined with it for adaptation to wire-wrapping is also a generally U-shaped member having a left-hand arm 16, a right-hand arm 17 and a bight 18 immediately under the bight 19 of the base member. This particular embodiment also has a left-hand downwardly-projecting leg 21 and a right-hand downwardly-projecting leg 22. These legs serve as pins for wire-wrapping thereon.

A plurality of the assemblies of FIG. 1 is mounted in a wiring board 23 of FIG. 2. This board can be a printed circuit board, simply a support board, or a combination support and circuit board. It can be a single layer circuit board or multi-layer circuit board. Eight of the socket assemblies of FIG. 1 are mounted to the board 23 as indicated at 11, for example. They are adapted to receive eight of the electrical leads 24 of the integrated circuit chip (IC) package 26 shown fragmentarily. Typically, at each package location on the circuit board, there are as many sockets as are needed to accommodate the many leads (24, for example) of an integrated circuit package.

Referring now to FIGS. 1 through 5C, the socket assembly is receivable into a pair of holes 27 and 28 of the circuit board 23. These holes are typically circular, spaced 0.100 inches apart, and the smaller hole 28 is approximately 0.041 inches in diameter and the larger hole 27 is approximately 0.067 inches in diameter. These particular dimensions, as well as other dimensions which will be given hereinafter are intended strictly for purposes of example, and not by way of any limitation in the invention.

The bight portion of the base member is placed snugly flush against the bottom surface 29 of the circuit board, and the left-hand arm 13 thereof projects upwardly in hole 28 to a point 31, just below the upper surface 32 of the circuit board. In contrast, the right-hand arm 14 projects above the surface of the circuit board a sufficient distance to provide a good, flexible leaf spring finger 38 for the socket, as will be described hereinafter. Thus it facilitates reception of a lead such as 24 from an IC package. The left arm is downwardly barbed as shown at 13*a* and 13*b* to facilitate upward entry of the arm into the aperture 28 but, by biting into the aperture wall, impede downward removal of the arm from aperture 28.

Figure 5A:
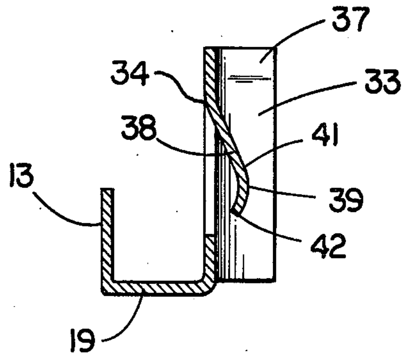
FIG. 5A is a section through the base member itself on the same cutting plane as FIG. 4.
Figure 5B:
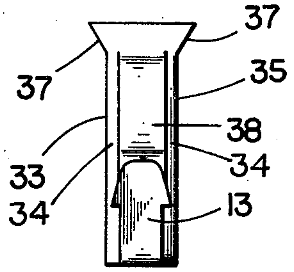
FIG. 5B is a left-hand end view of the base member.
Figure 5C:
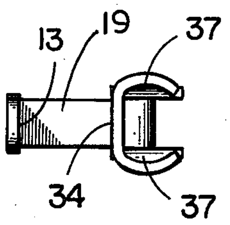
FIG. 5C is a top plan view of the base member.

The right-hand arm 14 is a channel having a C-shaped cross section, with the channel being formed by the front, rear, and left-hand walls 35, 33 and 34, respectively, of the arm. Although the left wall 34 is flat throughout its height from the bight 19 to the upper end 36, the front and rear walls are flat in the lower portions thereof as best shown in FIGS. 1 and 5B, but are flared outwardly near the top 36 to provide a somewhat conically-shaped entrance region near the top of the channel at 37.

Arm 14 includes a leaf spring portion 38 pierced through the left wall 34 and projecting downwardly and to the right toward the channel opening. The spring is curved at 39 to provide an inclined ramp portion 41 facing the upper end of the channel and an inclined ramp portion 42 facing the lower end of the channel. This enables movement of a circuit component lead such as 24 into and out of the channel between this spring and the inner contact surface 43 of the right arm 17 of the member 11. A typical material for the base member is a beryllium-copper alloy 172, half-hard, and 0.008 inches thick. This provides the desired electrical conductivity and the springiness for the spring portion 38 of the contact. Other spring materials might also be used.

The adaptor member of the contact assembly is called an adaptor because of the fact that it can be utilized in various configurations to adapt the socket assembly to various types of wiring techniques. The version shown in FIGS. 1 through 4 and 6A, 6B, 6C, 7A, 7B and 7C, is particularly adapted to wire wrapping circuit wiring methods and apparatus. In this example, the member has the left and right arms and legs 16, 17, 21 and 22 as previously mentioned, and a bight 18. The upper and inner faces of the bight and left arm, respectively, abuttingly engage the lower and left faces of the bight and left arm, respectively, of the base member. This occurs at lines 44 and 46, respectively, in FIG. 4. The right arm 17 is parallel to, coextensive with, but spaced from the left channel wall 34 so as to accommodate the entrance and reception of an IC circuit lead such as 24 in the direction of arrow 47. Such lead is received and resiliently secured between the crown portion 39 of the spring 38, and the inner wall 43 of the right arm 17. An entrance ramp 48 is provided at the upper end of the arm 17 and cooperates with the entrance ramps at 37 in the front and rear channel walls.

The left and right edges of the left and right arms are downwardly barbed at 16*a* and 17*a*, respectively, to facilitate upward entrance of the arms into the apertures 28 and 27 but, by biting into the walls of the apertures, resist downward removal of the member 11 from the board. The legs 21 and 22 project downwardly from the lower edge 49 of the bight portion 18 about 0.150 inches for one wrap of wire, or a greater distance for more wraps, and have a center-to-center distance at their lower ends of 0.1 inch. This adaptor member can typically be stamped from phosphor bronze material 0.025 inches thick. Other materials might also be used.

Figure 6A:
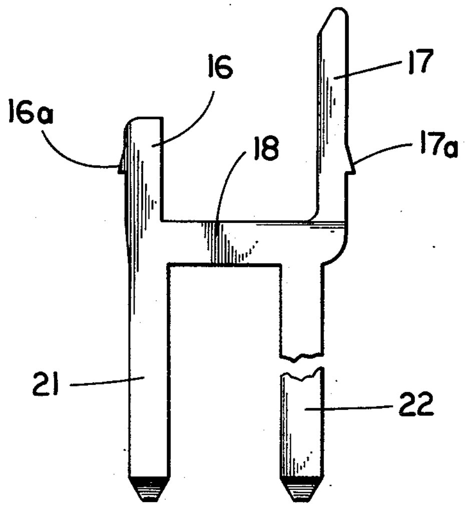
FIG. 6A is an elevational view of an adaptor member for wire wrap.
Figure 6B:
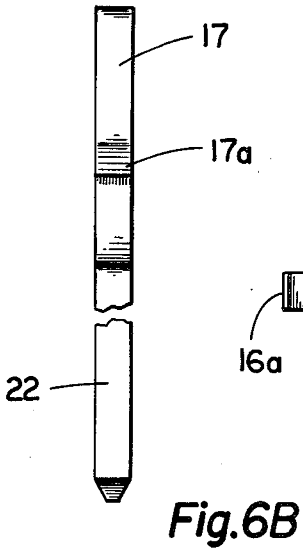
FIG. 6B is a right-hand end view of the wire wrap member.
Figure 6C:
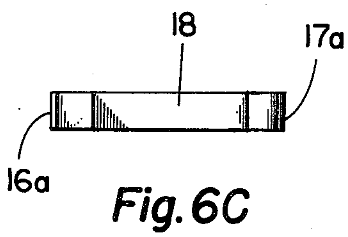
FIG. 6C is a top plan view of the wire wrap member.

FIGS. 6A through 6C, showing the wire-wrap adaptor member separate and apart from the base member, may assist in illustrating the shape of the member 11. Also they show that the barbs 16a and 17a are coextensive with the edges of the arms on which they are formed during the punching operation.

Figure 7A:
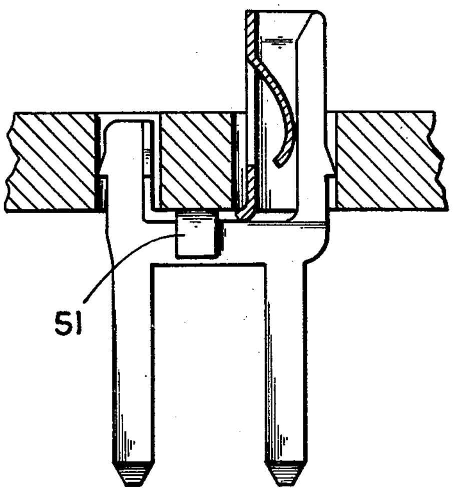
FIG. 7A is a view similar to FIG. 5A but showing a preassembled combination of the wire wrap member with the base member.
Figure 7B:
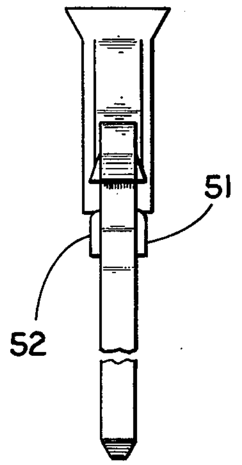
FIG. 7B is a view similar to FIG. 5B but showing the preassembled combination.
Figure 7C:
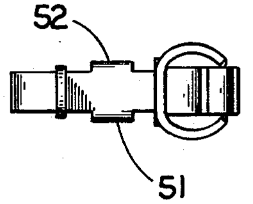
FIG. 7C is a top plan view similar to FIG. 5C but showing the assembled combination.

The mounting of the members to a circuit board can be done readily by machine and they are suitable for typical board thicknesses of 1/16 inch to ⅛ inch. If desired, the base member can be inserted first, in one operation, and the adaptor members can be then inserted in a second operation. If desired, both parts can be preassembled and inserted in a circuit board as an assembly. FIGS. 7A through 7C show such an assembly wherein the base member and adaptor member are as previously described except that the base member may have a pair of tabs 51 and 52 downturned from the bight 19 and straddling and snugly engaging the bight 18 of the adaptor member. The two members can thereby be preassembled, remain snugly in assembly, and then inserted in the circuit board as an assembly. The addition of the downturned tabs 51 and 52 to the bight 19 of the base member 12 is no problem because the member is stamped and formed anyway. No change is needed in the adaptor member 11.

Figure 8B:
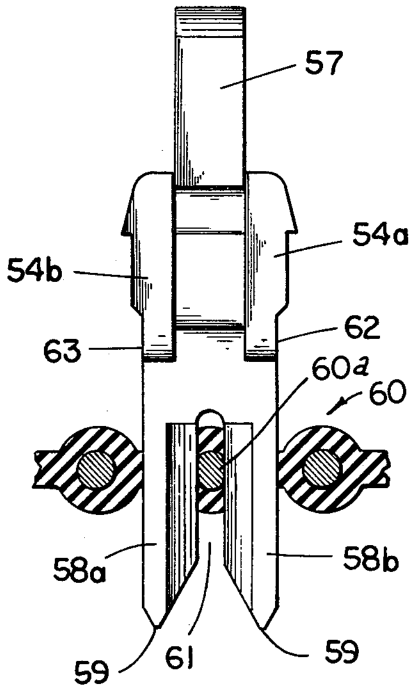
FIG. 8B is a left-hand end view thereof.
Figure 8A:
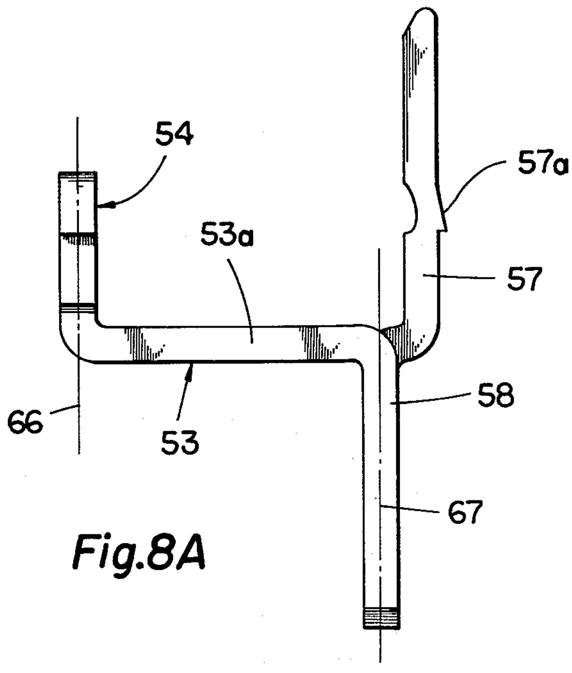
FIG. 8A is an elevational view of the adaptor member for insulation piercing.
Figure 8C:
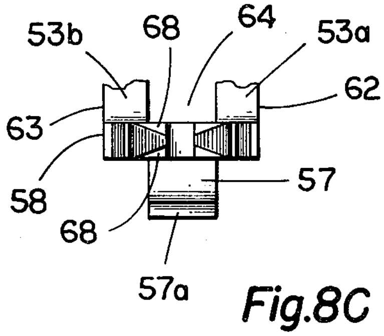
FIG. 8C is a fragmentary bottom view of the wire-piercing jaws thereof.
Figure 9A:
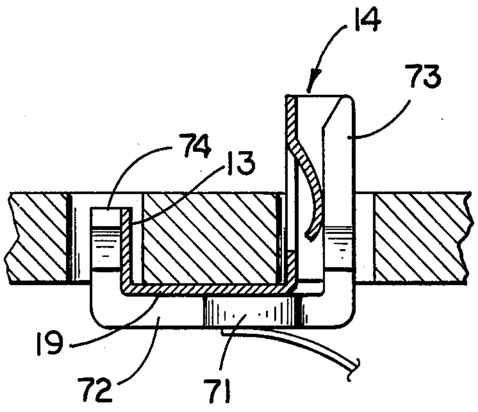
FIG. 9A is an elevational view of an adaptor for stitch weld connection of wiring to it.
Figure 9B:
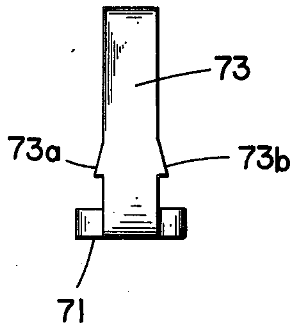
FIG. 9B is a right-hand end view thereof.
Figure 9C:
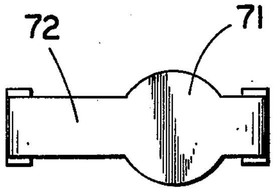
FIG. 9C is a bottom plan view thereof.
Figure 9D:
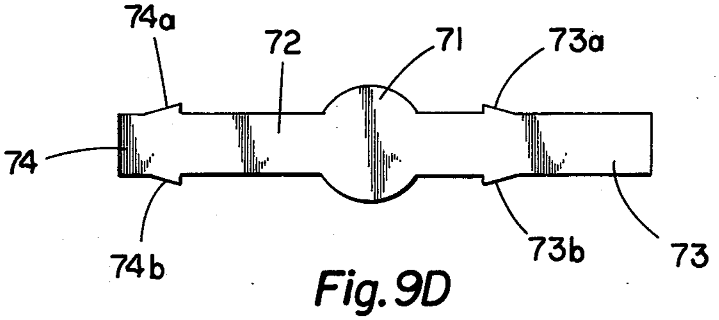
FIG. 9D is a view of the blank from which the adaptor member is formed.
Figure 8D:
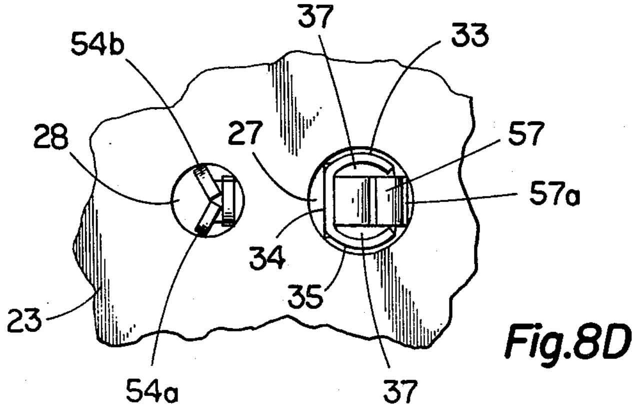
FIG. 8D is a fragmentary top view of a board incorporating the FIG. 8A embodiment but with the left-hand end posts crimped together to fit the same-sized hole as is used with the FIG. 1 embodiment, as shown in FIG. 3.

Referring now to FIGS. 8A through 8C, there is shown an adaptor member suitable for use where connection to circuitry is to be made by an insulation piercing and displacement connection, for example. In this particular embodiment, the adaptor member includes a bight 53, a pair of left-hand arms 54a and 54b, a right-hand arm 57 and a right-hand leg 58. Since this member is stamped and formed from flat stock, typically 0.015 inches thick; and since it is necessary to have a pair of prongs 58a and 58b in leg 58 provide the piercing points 59 for piercing insulation of a single wire or multi-wire ribbon cable 60 as shown in FIG. 8B, for example, the arms are made from the same end of the stock opposite the end at which the points 59 are formed. This is done by forming the right arm 57 from the center of the stock between the edges 62 and 63. The result is that the bight is actually bifurcated, being comprised of two parallel bight portions 53a and 53b, with a space 64 between them and from which the arm 57 was obtained. The left-hand ends of the bight portions 53a and 53b are turned upwardly to form the left arm portions 54a and 54b, likewise spaced. In this example, as with the first-described adaptor member, the distance between the center line 66 of the arms 54a and 54b, and the center line 67 of the socket when the unit is assembled with the base member, will be 0.100 inches, just as before. However, because of the necessity of providing the arms 54a and 54b from the same portion of the stock as is arm 57, an anchor hole of diameter larger than hole 28 for the previously-described embodiment, may be used to accommodate the pair of left-hand arms. Alternatively, the arms 54a and 54b can be crimped together as shown in FIG. 8D for reception in aperture 28 of the same size as employed for the embodiments of FIGS. 1 (4), 7A and 9A. Each of these arms 54a and 54b is provided with a downwardly-projecting barb and arm 57 also is provided with a downwardly-projecting barb, to facilitate upward entrance of the arms into the circuit board, but inhibit downward removal from the circuit board.

The prongs 58a and 58b may be formed with inclined faces as at 68 to aid in the piercing of insulation and the gripping of the wire 60a received in the slot 61. When a number of these units is employed in the circuit board, such as twelve of them for each side of an IC package, they may be conveniently connected to a single wire or ribbon-type multi-wire cable.

FIGS. 9A through 9D illustrate another alternative form of adaptor member. In this example, the adaptor member may be stamped and formed from a blank such as appears in FIG. 9D because, in place of a pair of legs 21 and 22, it has an enlarged area 71 in the bight portion 72 which serves as a stitch weld or solder pad. The right arm 73 is similar to the right arm 17 of the first embodiment except that the downwardly-directed barbs 73a and 73b are located differently on this arm as is also true of arm 74 in order that they can be formed in a single stamping operation. This adaptor is used and combined with the base member as previously described with reference to FIGS. 1 through 4. By providing tabs adjacent the pad areas 71, and such as previously described with reference to FIG. 7A through 7C, this unit can be used in an assembly with the base member for preassembly and then installation in the board, if desired.

Figure 10:
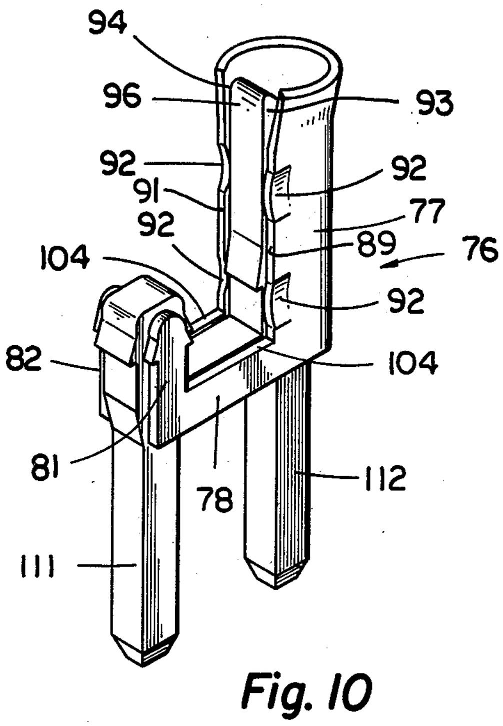
FIG. 10 is a perspective view of a socket assembly according to a preferred embodiment of the present invention and useful for "Wire Wrap".
Figure 11:
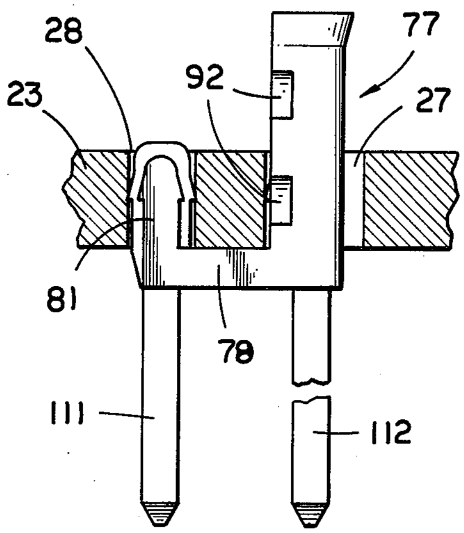
FIG. 11 is a side elevational view of the socket assembly of FIG. 10 as installed in a circuit board, which is shown in section.

Referring now to FIGS. 10 and 11, showing the preferred embodiment of the contact assembly, the base member 76 includes a right arm 77, front bight portion 78, rear bight portion 79, front left arm portion 81, and rear left arm portion 82. The details of this member may be better understood by referring to FIGS. 12A through 12D. This member may be cold formed from a strip of beryllium copper alloy 172, half hard, ASTM B 196, 0.008 inches thick. It is formed such that the right arm 77 has a semicircular upper entrance edge 83 opening to the left toward the left arms 81 and 82. The entrance portion 84 is conical as shown in FIGS. 12A through 12D, with a transition to a generally box-shaped channel portion having a right-hand outer wall 86 and front and rear walls 87 and 88. The walls 86, 87 and 88 cooperate to form a vertically extending channel opening to the left towards the left-hand arms 81 and 82. The left-hand, channel-opening defining edges 89 and 91 are formed at two vertically spaced locations 92 to provide semicylindrical bosses to locate front and rear faces 93 and 94 (FIG. 10) of the right arm 96 of the adapter member in the assembly.

Figure 12A:
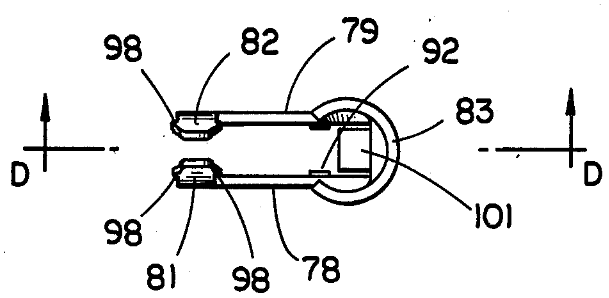
FIG. 12A is a top view of a base member of the socket assembly of FIGS. 10 and 11.
Figure 12B:
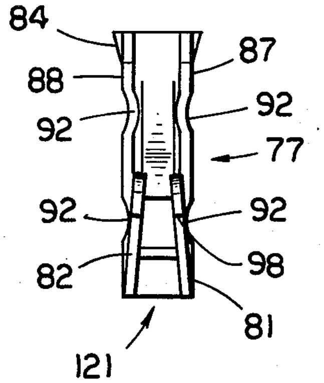
FIG. 12B is a left-hand end view thereof.
Figure 12D:
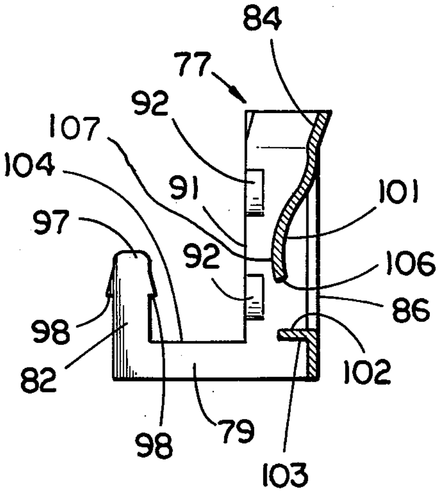
FIG. 12D is a section therethrough taken at the line D-D in FIG. 12A and viewed in the direction of the arrows.
Figure 12C:
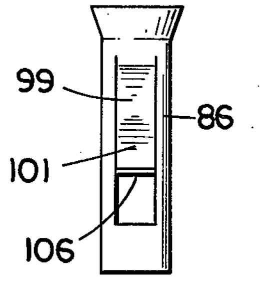
FIG. 12C is a right-hand view thereof.

The left arms converge upwardly and inwardly as best shown in FIG. 12B and have rounded and tapered upper ends as at 97 in FIG. 12D with the taper terminating at downwardly and outwardly projecting barbs 98 to assist in retention of the arms in an aperture in a circuit board as will be described hereinafter.

The right end wall 86 has a slot 99 pierced therein resulting in a downwardly and inwardly extending leaf spring 101 which projects to the left more than half the way from the right end wall 86 to the channel opening edge 91 of the right arm 77. It also provides a tab 102 projecting horizontally to the left and having a bottom surface 103 which is coplanar with the upper edge 104 of each of the two bights. The tab projects to the left under the spring. The spring is curved so that the lower edge 106, being farther to the right than the crown 107 of the spring will not intefer with removal of a pin or component terminal from the socket, as will be more fully appreciated as the description proceeds.

Figure 13C:
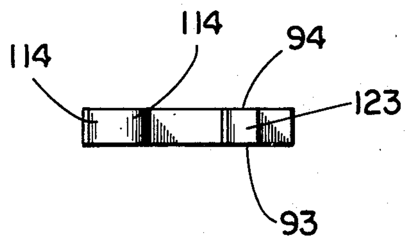
FIG. 13C is a top view thereof.
Figure 13A:
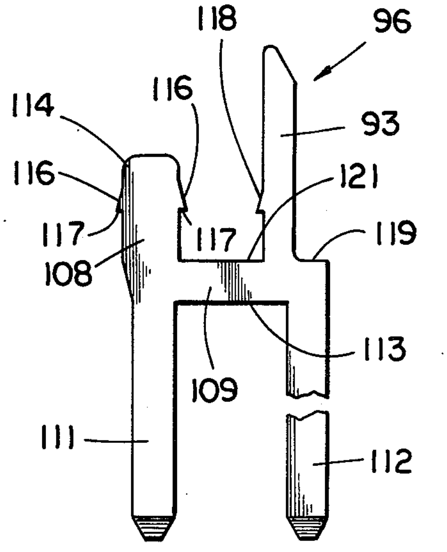
FIG. 13A is a front view of the adaptor member of the socket assembly of FIGS. 10 and 11.
Figure 13B:
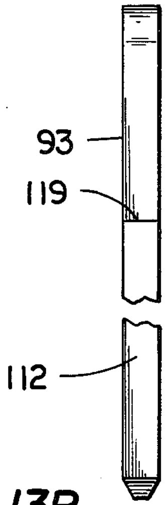
FIG. 13B is a right-hand end view thereof.

FIGS. 13A, 13B, and 13C show three views of the adaptor member used in combination with the base member 76 in the assembly of FIGS. 10 and 11. This adaptor member has the right arm 96, left arm 108, bight 109, left leg 111 and right leg 112. An example of sheet material suitable for this member is phosphor bronze, grade A, having a 90,000 to 105,000 psi tensile strength and 0.025 inch thickness. The legs are approximately 0.150 inches long from the lower edge 113 of the bight 109 to the lower ends of the legs. They are intended for wire-wrapping on them. The upper left arm 108 is rounded at 114 at the upper end to facilitate insertion in a hole 28 in board 23. It has barbs 116 on its left and right edges and which are inclined upwardly but which have horizontal lower edges 117 whereby insertion in the hole is facilitated, but downward removal is inhibited by the biting of the barbs 117 to the wall of the hole 28. A similar barb 118 is provided on the left-hand edge of the right arm 93, to bite into the wall of the hole 27 in the board 23. A shoulder 119 extends to the right from the right arm 93 above the leg 112. It is coplanar with the upper edge 121 of bight 109.

In the assembly to board 23, the base member is inserted first upwardly from the bottom of the board. It will enter the board readily since the width of the left arm 82 is considerably less than the diameter of the hole 28 which, for this embodiment, is preferably 0.046 inches diameter. Also the front and rear left arms 81 and 82 converge as shown in FIG. 12B.

Figure 11A:
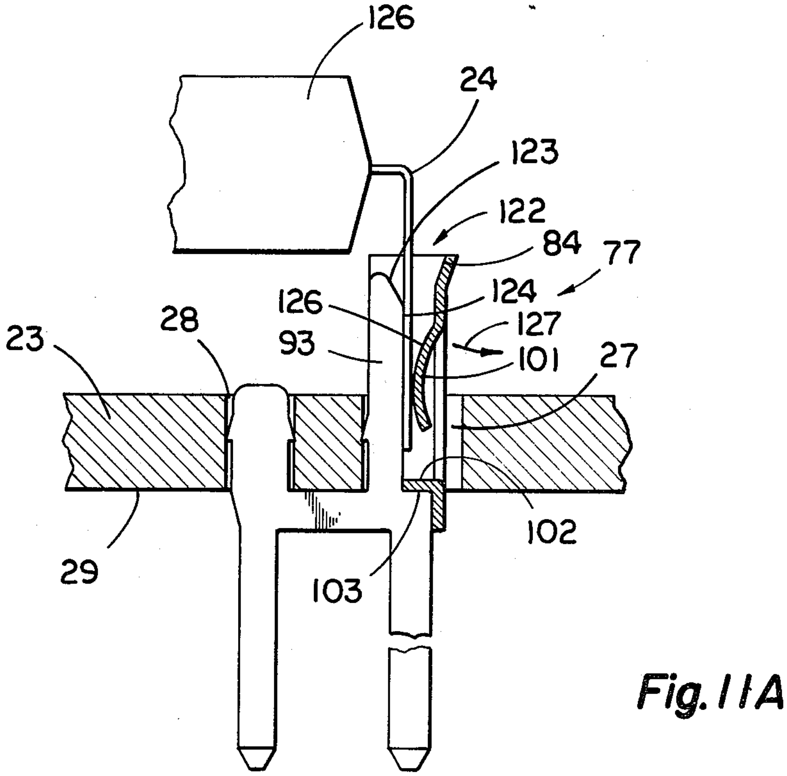
FIG. 11A is a section through the assembly of FIG. 11 taken in a vertical plane between the rear face of the front arm and and the front face of the retainer member, and showing an IC package 26 having a mounting and contact lead thereof received in the socket formed by the socket assembly.

The adaptor member is then inserted upwardly through the space 121 between the front and rear left arms and bight and channel opening in the base member. It is pushed upwardly until the upper edge 121 of the bight engages the lower face 29 of the circuit board. Meanwhile, the left arm 108 spreads the front and rear left arms of the base member so that the barbs 98 on the left front and rear arms 81 and 82 bite into the cylindrical wall of the hole 28. At the same time, the barbs 116 on left arm 108 engage the wall of the hole 28 in the board to inhibit removal of the adaptor member. Likewise barb 118 on right arm 93 engages the wall of the hole 27 to inhibit removal. The shoulder 119 abuttingly engages the bottom 103 of the support tab 102 on the base member (as shown in FIG. 11A). This enables the adaptor to help prevent the right arm of the base member from moving downward with respect to the board so that the adaptor serves also as a retainer member. Also tab 102 and shoulder 119 can be useful to help locate the two members together for pre-assembly before mounting to the board, if this procedure is preferred. Also it can be helpful in machine assembly of the members to the board.

After sufficient socket assemblies have been mounted to the board to accommodate the number of leads on the circuit component to be mounted to the board, the circuit component such as an IC package 26, for example, can be mounted in the assembly by downward insertion of the terminal leads such as 24 (FIGS. 2 and 11A) into the socket 122 formed by the cooperation of the right arms of the base member and adaptor member. In addition to the tapered lead-in semi-cone entrance 84 of arm 77, the taper or ramp 123 at the upper end of the adaptor member facilitates entrance of the lead 24 of the IC package into the socket 122 along the outer right-hand edge 124 of the arm 93 of the adaptor member. As the lead 24 engages the ramp surface 126 of the spring 101, the spring is deflected outward in the direction of arrow 127 and, when the lead is inserted as far as desired, the spring retains it in secure electrical and mechanical contact with the edge 124 of arm 93. Thus the IC package 26 is securely mounted mechanically and electrically in the socket 122 as shown in FIG. 11A.

It was mentioned above that the thickness of the stock for the retainer member may be 0.025 inches, for example. The width of the spring 101 and the tab 102 is nominally the same 0.025 inches. The width of the entrance slot 121 between the inner faces of the front and rear bight portions and front and rear left arm portions at the lower edge thereof is nominally 0.030 inches. The space between the inner faces of the upper ends of the left arm portions is 0.020 inches before they are spread by the left arm 108 of the adaptor member. The narrowest space between the facing bosses 92 is 0.030 inches. Therefore, although these bosses do not interfere with entrance of the right arm 93 of the adaptor member upward in the channel opening, they do serve to closely locate it in the assembly.

Figure 14:
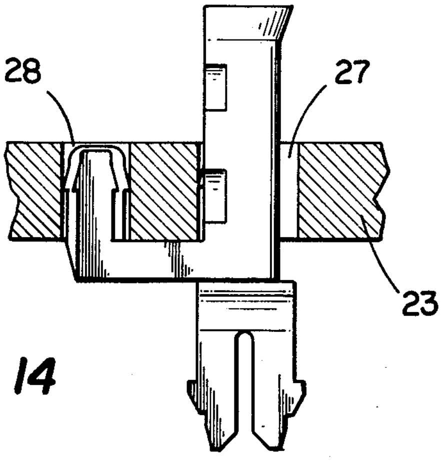
FIG. 14 is an elevational view of a socket assembly similar to that of FIGS. 10 and 11, but including a insulation piercing yoke instead of "Wire-Wrap" pins.
Figure 14A:
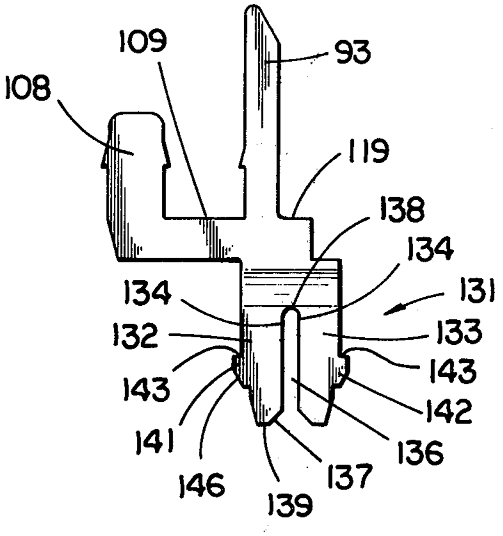
FIG. 14A is a front elevational view of the adaptor member of the assembly of FIG. 14.
Figure 14B:
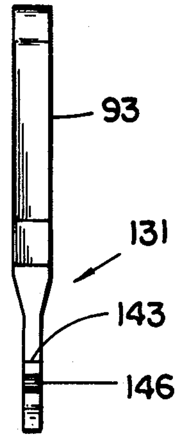
FIG. 14B is a right end view thereof.
Figure 14C:
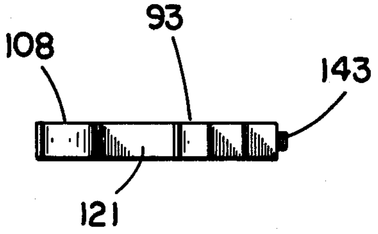
FIG. 14C is a top plan view thereof.

Referring now to FIGS. 14 through 14C, there is shown an assembly which is similar to that of FIGS. 10 and 11, except that instead of providing for wiring-wrapping, it provides a insulation-piercing construction. It is similar in that respect to the embodiment of FIG. 8A through 8C, but the shape and orientation of the wire-piercing yoke is somewhat different. More specifically, as shown in FIG. 14A, the left arm, right arm, and bight 108, 93, and 109, respectively, are the same as in the embodiment of FIG. 13A, so they receive the same reference numerals. Instead of legs 111 and 112, there is a wire-piercing yoke 131 projecting downward from the bight 109 and having the fingers 132 and 133 having inner facing edges 134 defining a wire-receiving slot 136. This slot has a tapered entrance on each of the fingers as at 137, and receives an electrical conductor in the same manner as shown in FIG. 8B. The 0.025 inch thick stock of the arms and bight is reduced to 0.015 inches from the top of the slot at 138 downward throughout the length of the fingers to the points 139 at the bottom thereof. The fingers 132 and 133 of the yoke have retainer lugs 141 and 142 projecting in opposite directions from the outer edges of the fingers. The upper edges 143 of the lugs provide shoulders to resist removal of the yoke from a single wire or multi-wire ribbon cable such as shown in FIG. 8B. The tapered lower edges 146 of the lugs facilitate entry of the lugs into a ribbon conductor.

The adaptor member of FIGS. 14 through 14C can typically be made of phosphor bronze, grade A having a 90,000 to 105,000 PSI tensile strength and nominal thickness of 0.025 inches. In contrast to that of the embodiment of FIG. 8A through 8C, the insulation-piercing yoke in this embodiment is coplanar with the arm and bight portions. This makes it a more easily manufactured part.

Figure 15A:
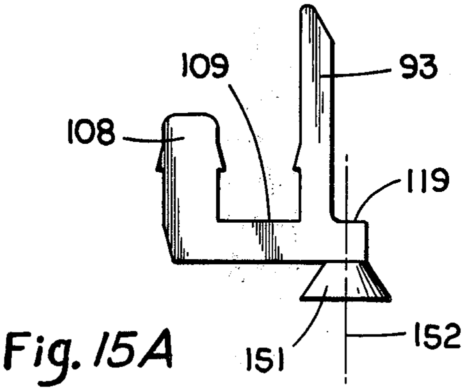
FIG. 15A is an elevational view of the adaptor member of the assembly of FIG. 15.
Figure 15:
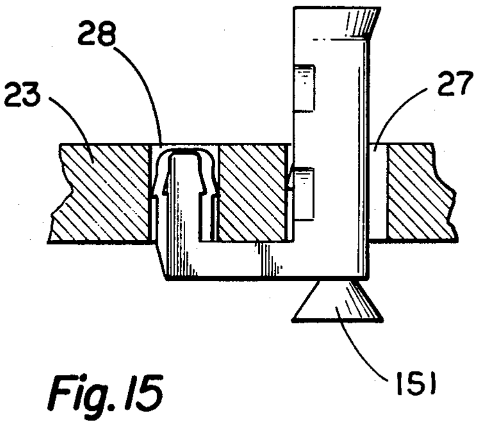
FIG. 15 is an elevational view of a socket assembly similar to that of FIGS. 10 and 11 but including a "Stitch Weld" boss or pad instead of "Wire-Wrap" pins.
Figure 15C:
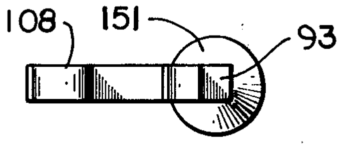
FIG. 15C is a top plan view thereof.
Figure 15B:
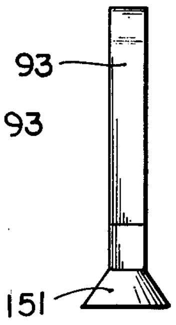
FIG. 15B is a right-hand end view thereof.

Referring now to FIGS. 15 through 15C, a further embodiment is shown which lends itself to stitch-welding to circuit wires. As in the case of the insulation-piercing embodiment, the base member is the same as for the wire-wrap embodiment of FIGS. 10 and 11. The adaptor member has the same left arm, right arm, and bight as for the embodiment of FIGS. 10 and 11. Therefore, they are given the same reference numerals in FIGS. 15 through 15C. In this embodiment, a stitch-weld boss is provided at 151. It has a frusto-conical configuration having a central axis 152 which, in the assembly, is colinear with the center line of the mounting hole 27 in the circuit board. The adaptor member may be 0.025 inches thick and made of stainless steel, for example. The boss itself can be formed in the same material under the shoulder 119 so it is obviously thicker than the stock itself. Shoulder 119 can serve the same purposes in this embodiment as it does in the previously described embodiments. The bottom of the boss is a flat pad facilitating stitch welding or soldering of circuit wire to it as is true of the pad of FIGS. 9A–9D.

Advantages of the present invention include the following:

(a) The product has a very low profile by comparison with other wire wrap systems.

(b) Excellent wire-wrap pin alignment can be achieved and, because the wire-wrap pins of the adaptors according to this invention are shorter than conventional wire-wrap pins, the 0.01 inch TIR (total indicator reading) specification for automatic wiring machines can be more readily met even if the contact or socket assembly is not put into the circuit board exactly perpendicular to the board surface.

(c) There is less chance of breaking a wire-wrap pin when wrapping it with wire, because good alignment of the pin minimizes the chance of the wire-wrapping machine head hitting the pin and breaking it, and the provision of two pins permits wrapping with two wraps without applying both wraps to the same pin.

(d) Since there are two posts pressed into two holes in the circuit board, the hole remote from the center line of the pin being wrapped, and the post in that hole, cooperate to anchor the socket assembly so that the socket assembly will not be turned in the hole as might otherwise occur when a good high wire-wrapping torque is applied to a pin during the wrapping operation.

(e) The socket is useful in circuit boards having the same space restraints as existing boards. Where the socket is to be used by a manufacturer who has wire-wrapping machines with tape programs already in existence, the socket of the present invention can be provided with the pin 22 (FIG. 4) or 112 (FIG. 11A) of the normal 0.300 inch length to accommodate two wraps by the wire-wrapping machine as already programmed for conventional socket pin wrapping. The additional pin 21 (FIG. 4) or 111 (FIG. 11A) can be only 0.150 inches in length to accommodate a wrap in the event an error has been made in the first or second wrap on pin 22 or 112. Moreover, if it is desired to do so, either or both of the pins on an adaptor member can be made sufficiently long for two or three wraps. Nevertheless, in view of current space restraints in many applications, it is not too likely that either of the pins would be made sufficiently long for three wraps.

(f) Where the socket of the present invention is to be used by a customer who does not have his tape-controlled machines programmed for use with conventional sockets and pins, the machine can be programmed for applying one wrap to each of the two pins of an adaptor member, and thus the overall length of the pins can be only 0.150 inches to accommodate the single wrap. Of course, additional pin length can be employed, if desired.

(g) Because the pins are short, there is reduced likelihood of bending them and having them electrically short against each other.

(h) The particular construction lends itself readily to adaptation to other types of circuit wiring techniques, other than wire-wrapping.

(i) Both the base member and adaptor member can be very inexpensive, as they can be stamped or punched from coil or sheet stock, and cold formed, if needed, to provide the illustrated shapes.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

Having thus described the invention, what is desired to be claimed and secured by Letters Patent is:

1. An electrical connector comprising:
a first member having a generally U-shaped portion with a horizontal bight and vertical left and right arms at opposite ends of said bight,
said right arm including a channel having a vertically extending opening at one side of the arm, and said right arm including a spring projecting into said channel from a wall of said channel;
a second member having a generally U-shaped portion with a horizontal bight and vertical left and right arms at opposite ends of said bight,
said left arm of said second member being adjacent said left arm of said first member; and
said right arm of said second member being in the channel and adjacent said spring.

2. The connector of claim 1 wherein:
said spring projects downwardly toward a lower end of said channel and laterally toward the opening of said channel, the projection of said spring being from a portion of said wall opposite said opening.

3. The connector of claim 2 wherein:
said first member of said connector is made of an electrically conductive resilient material.

4. The connector of claim 3 wherein:
said spring is a leaf-type spring and includes a curved portion extending to a point more than half the distance from said wall portion toward said opening.

5. The connector of claim 4 wherein:
said curved portion provides inclined ramps facing both the upper and lower ends of said channel.

6. The connector of claim 1 wherein:
said channel is C-shaped in horizontal cross section.

7. The connector of claim 6 wherein:
said left arm of said first member is barbed to facilitate upward entry and impede downward removal of said arm from an aperture in a board.

8. The connector of claim 1 wherein:
said right arm of said second member extends vertically in said opening and parallel to said wall and substantially fills said opening.

9. The connector of claim 8 wherein:
said arms of said second member are barbed to facilitate upward entry and impede downward removal of said second member from apertures in a board.

10. The connector of claim 1 wherein:
said right arms of said first and second members cooperate to form an upwardly opening socket.

11. The connector of claim 10 wherein:
said right arms have tapered upper ends facilitating entrance of a pin into said socket.

12. The connector of claim 1 wherein:
said bight of said first member has a pair of parallel legs projecting downwardly therefrom and saddled on the bight of said second member and holding said first and second members together.
13. The connector of claim 1 wherein:
said first member is a formed stamping of 0.008 inch thick beryllium copper alloy.
14. The connector of claim 13 wherein:
said second member is a stamping of 0.025 inch thick phosphor bronze alloy.
15. The connector of claim 1 wherein:
said second member includes a pair of legs generally aligned with said arms.
16. The connector of claim 15 wherein said legs are of rectangular cross section and receptive to wire wrap.
17. The connector of claim 16 wherein:
said legs are of a length less than 0.160 inches.
18. The connector of claim 1 wherein:
said second member has a frusto-conical boss with pad on the bottom for welding of conductors thereto.
19. The connector of claim 18 wherein:
said second member is a stamping of 0.025 inch thick stainless steel, and said boss is under said right arm of said second member, and is adapted to stitch welding of electric wire to it.
20. The connector of claim 1 wherein:
said second member has a insulation piercing yoke projecting downward from said right arm.
21. The connector of claim 20 wherein:
said first and second arms, said bight, and said yoke of said second member are co-planar.
22. The connector of claim 21 wherein:
said yoke has a pair downwardly pointed, wire slot forming fingers, and a pair of oppositely projecting retainer lugs on edges of said fingers opposite slot defining edges of said fingers.
23. The connector of claim 1 and further comprising:
a wiring board having a plurality of apertures therein; said left arms being received in one of said apertures,
said right arms being received in another of said apertures,
the bight of said first member abuttingly engaging the bottom of said board between said one aperture and said another aperture.
24. The connector of claim 23 wherein:
said one aperture and said another aperture are of different sizes,
the two right arms cooperating to provide an upwardly opening electrical socket member in said another aperture.
25. The connector of claim 1 or 23 wherein:
said bight of said second member has a horizontally enlarged solder pad area thereon.
26. The connector of claim 25 wherein:
said second member is formed from sheet stock and has barbs extending laterally from the front and rear edges of said left and right arms, and said pad area extends laterally from the front and rear of said bight of said second member.
27. The connector of claim 23 wherein:
said second member has a wire-piercing yoke projecting downward from said right arm.
28. The connector of claim 27 wherein:
said bight and left arm of said second member are bifurcated.
29. The connector of claim 28 wherein said left arm of said second member is crimped so as to be functionally homogeneous.
30. The connector of claim 1 wherein:
said channel opens to the right, and said spring is a leaf-type spring, and said left arm of said second member is on the left side of said left arm of said first member, and said bight of said second member is directly under and in contact with said bight of said first member, and said right arm of said second member is adjacent and on the right side of said spring.
31. The connector of claim 1 wherein:
said channel opens to the left and said bight comprises a front bight portion extending to the left from the right arm at the bottom front margin of the channel opening, and a rear bight portion extending to the left from the bottom rear margin of the channel opening, and said left arm comprises a front arm portion extending up from a left hand end of said front bight portion, and said left arm further comprises a rear arm portion extending up from a left-hand end of said rear bight portion.
32. The connector of claim 31 wherein:
said spring projects to the left toward the channel opening from the right side wall of said channel.
33. The connector of claim 32 wherein:
said left arm of said second member is located between the front and rear portions of said left arm of said first member;
said bight of said second member is located between the front and rear portions of said bight of said first member; and
said right arm of said second member is adjacent and on the left side of said spring.
34. The connector of claim 33 wherein:
said right arm of said second member is parallel to said channel wall and extends upwardly in said opening.
35. The connector of claim 34 wherein:
said arms of said second member are barbed to facilitate upward entry and impede downward removal of said second member from apertures in a board.
36. The connector of claim 33 wherein:
said right arm of said first member and said right arm of said second member cooperate to form an upwardly opening socket.
37. The connector of claim 36 wherein:
said right arm of said first member and said right arm of said second member have tapered upper ends facilitating entrance of a pin into said socket.
38. The connector of claim 23 or 33 wherein:
said right arm of said first member has a tab portion projecting to the left from said right-hand wall portion and under said spring and having a bottom surface in a plane containing a top edge of said bight of said first member, and
said second member has a shoulder extending horizontally to the right of said right arm of said second member in a plane containing a top edge of said bight of said second member,
said tab being positioned atop and in direct contact with said horizontal shoulder.
39. The apparatus of claim 38 wherein:
the right arm of said second member is barbed to facilitate upward entry and impede downward removal of said arm from an aperture in a board receiving said members, whereby said first member is retained in said aperture.

* * * * *